United States Patent
Sakai et al.

[11] Patent Number: 6,148,055
[45] Date of Patent: Nov. 14, 2000

[54] COUNTER AND A REVOLUTION STOP DETECTION APPARATUS USING THE COUNTER

[75] Inventors: Masayoshi Sakai; Koichi Futsuhara, both of Urawa, Japan

[73] Assignee: The Nippon Signal Co., Ltd., Toyko, Japan

[21] Appl. No.: 08/860,197

[22] PCT Filed: Aug. 7, 1996

[86] PCT No.: PCT/JP96/02229

§ 371 Date: Jun. 19, 1997

§ 102(e) Date: Jun. 19, 1997

[87] PCT Pub. No.: WO97/14044

PCT Pub. Date: Apr. 17, 1997

[30] Foreign Application Priority Data

Oct. 11, 1995 [JP] Japan .................................... 7-263142

[51] Int. Cl.[7] .................................................. G06M 3/00
[52] U.S. Cl. ................................. 377/28; 377/47; 327/48
[58] Field of Search .............................. 377/28, 16, 19, 377/30, 114, 111, 47; 327/20, 47, 48

[56] References Cited

U.S. PATENT DOCUMENTS 4,189,635  2/1980  Sheller ...................................... 377/29
4,881,248  11/1989 Korechika ................................ 377/17
5,127,035  6/1992  Ishii ........................................ 377/24

FOREIGN PATENT DOCUMENTS 51-154148  12/1976  Japan .
54-103665  8/1979   Japan .
06338773   12/1994  Japan .

*Primary Examiner*—Timothy P. Callahan
*Assistant Examiner*—Minh Nguyen
*Attorney, Agent, or Firm*—Jacobson, Price, Holman & Stern, PLLC

[57] ABSTRACT

A counting apparatus having excellent fail-safe characteristics can be used in a rotation-stopped detection apparatus. As a first feature, timing of a high-frequency signal $P_2$ is carried out by a counter 1 after completion of a counting of pulse signals $P_1$. When the frequency of the timing output for the high-frequency signal is a predetermined value, a judgment signal, indicating that the counting is normal, is generated by a frequency discriminating circuit 30. As a second feature, a counter 100 is preset using a preset signal. Then, after verifying by an output from a self hold circuit 102 that the counter 100 has been reset, a counting output is generated from a self hold circuit 104. As a third feature, the counting apparatus is used as timer circuits 203, 300, 400, and the generation frequency of a rotation detection pulse signal $I_P$ based on a sensor signal, is obtained to thereby detect a rotation-stopped condition of a rotating body.

10 Claims, 10 Drawing Sheets

COUNTER AND A REVOLUTION STOP DETECTION APPARATUS USING THE COUNTER

TECHNICAL FIELD

The present invention relates to a counting apparatus which can output counting results while monitoring for whether or not a counting operation is being carried out normally. Moreover the invention relates to a counting apparatus which verifies that the apparatus has been reset to an initial condition, before beginning the counting operation. Furthermore, the present invention relates to a rotation stopped detection apparatus which uses a counting apparatus to detect, in a fail-safe manner, if a rotation body has stopped rotating.

BACKGROUND ART

Heretofore, as a counting apparatus which carries out a counting operation while monitoring for whether or not the counting operation is being carried out normally, there is for example a device as disclosed in Japanese Examined Patent Publication No. 4-41532, which is utilized in a time element circuit.

In this time element circuit, there is provided two oscillators having different oscillation frequencies, the arrangement being such that when an input voltage is lost, a high frequency oscillation output from one of the oscillators is input to a counter. When the high frequency oscillation output reaches a predetermined number the counter is set, and due to the output from the counter, a delay output from after the loss of the input voltage is self held. Then due to the self held output, a low frequency oscillation output from the other oscillator is input to the counter. Subsequently, when the low frequency oscillation output attains a predetermined number, the counter is reset and the output from the self hold circuit is stopped. More specifically, the construction is such that the number of inputs of low frequency oscillation outputs is counted from after the high frequency oscillation output has reached a predetermined number, to thereby obtain the delay time. By using a counting apparatus in this way, the precision of the time element circuit is increased.

However, with the above described conventional counting apparatus applied to a time element circuit, monitoring for whether or not the counter is operating normally is carried out before counting the low frequency oscillation output, at the point in time of starting the counting operation for the low frequency oscillation output. This is done by making the counter carry out a high speed counting operation using the high frequency oscillation output. That is to say, with the conventional counting apparatus, the construction is such that monitoring of the operation of the counter is carried out before the counting operation for the input signal of the signal being counted.

In practice however, whether or not the counter is operating normally, should be ascertained after completion of the counting operation for the input signal of the signal being counted, so that the latest operating condition for the counter is monitored.

Moreover, the above described counter is generally an electronic circuit comprising a plurality of frequency dividers connected in cascade. For this to be a so called fail-safe counter where an input pulse signal of the signal being counted is counted and an output is not produced until this reaches a predetermined number, while at the time of a fault, the generation of an output is never premature, then for the counter to fulfill the important role in a control where safety is of concern, the abovementioned fail-safe counter performance is required.

Conventional counters however do not necessarily satisfy the abovementioned fail-safe counter performance.

For example, a counter may be considered wherein n frequency dividing circuits made up of flip-flop circuits (referred to hereunder as F•F circuits) are connected in cascade. Here if the signal being counted is a clock signal, then the counting operation is carried out using, for example, the falling of the clock signal.

In this case the frequency dividing circuits are reset when a reset signal of an L level is input to an active low reset terminal, and the counting operation is started when the reset signal rises to an H level. Then, after the reset signal rises, and once $2^{n-1}$ clock signals have been input, the n−1th frequency dividing circuit output drops and the output from the final frequency dividing circuit rises, and a count output is produced indicating that the number of inputs of clock signals has reached a predetermined number.

However, in the case for example where the reset terminal of the n−1th frequency dividing circuit has an open fault, then even if the reset signal is input, the n−1th frequency dividing circuit cannot be reset. In this case, when the reset is released and the counting operation started, it is not possible to know if the n−1th frequency dividing circuit is in the reset condition. If the n−1th frequency dividing circuit is in the reset condition (the output is an H level), then after commencement of the counting operation, the output from the n−1th frequency dividing circuit falls at the point in time when the $2^{n-2}$ clock signals are input, and at this point in time, the output from the final stage frequency dividing circuit rises and the counter output is thus produced.

That is to say, after commencement of the counting operation, the counter output which should rise at the point in time of input of the $2^{n-1}$ clock signals, rises at the point in time of input of the earlier $2^{n-2}$ clock signals. The counter output is thus produced at an earlier point in time than is desirable, and hence fail-safe count performance is not satisfied.

As a fault mode for the frequency dividing circuits which make up the counter, a fault wherein the output becomes fixed, or a short circuit fault between the input and output can be considered. If such a fault occurs in any one of the n frequency dividing circuits, then the counter output becomes fixed, or the frequency of the clock signal becomes constant so that the counter output frequency becomes higher than at the time of normal operation. Consequently with these types of faults, if the output frequency of the counter is monitored then they can be found.

The present invention takes into consideration the above situation, with the object of a first aspect of the invention being to provide a counting apparatus which can monitor if a counting operation is normal, after completion of the counting operation. Moreover an object of a second aspect of the invention is to provide a counting apparatus which starts a counting operation after first confirming a reset condition. Furthermore, an object of a third aspect of the invention is to provide a rotation stopped detection apparatus which uses a counting apparatus to detect, in a fail-safe manner, if a rotation body has stopped rotating.

DISCLOSURE OF THE INVENTION

The counting apparatus according to the first aspect of the invention comprises: a pulse counting device for counting the number of inputs of pulse signals of a signal being counted, and generating an output when the number reaches a predetermined value; a signal switching device for switching the input signal to the pulse counting device between the pulse signal and a high frequency pulse signal of a higher frequency than the pulse signal; a control device for controlling the signal switching device so that the high frequency pulse signal is input to the pulse counting device when the output from the pulse counting device is input thereto; and a frequency discriminating device which takes the input of a dividing signal generated from the pulse counting device each time the number of inputs of the high frequency pulse signal reaches the predetermined value, and which generates a normal judgment output indicating that the counting operation of the pulse counting device is normal only when the dividing signal is a predetermined frequency.

With such a construction, the pulse counting device counts the pulse signals of the signal being counted, and when the number of inputs reaches a predetermined number, the signal switching device is driven by the output from the control device, so that a high frequency pulse signal of a frequency higher than that of the pulse signal of the signal being counted is input to the pulse counting device. The pulse counting device then generates a dividing signal for each predetermined number of inputs of the high frequency pulse signal, and the normalcy of the counting operation is judged from the frequency of this dividing signal.

If the frequency of the dividing signal is a predetermined frequency, then an output signal indicating that the counting operation of the pulse counting device is normal is generated from the frequency discriminating device. If the frequency of the dividing signal is outside of a predetermined frequency, then there is no output signal from the frequency discriminating device, thus indicating that the pulse counting device is abnormal.

In this way, the counting operation of the pulse counting device can be monitored for normalcy based on the input of the high frequency pulse signal, after completion of the counting operation for the pulse signal of the signal being counted.

The control device may basically comprise a first self hold circuit which, under the condition that a pulse signal of the signal being counted is being input to the hold terminal, generates an output signal when the output from the pulse counting device is input to a trigger terminal, and feeds this back to the trigger terminal to thus self hold the output signal.

With such a construction, the monitoring of the counting operation by the high frequency pulse signal continues until the pulse signal of the signal being counted falls.

Basically, the signal switching device comprises: an oscillator for generating the high frequency pulse signal, a logical product operation circuit for carrying out a logical product operation on the high frequency pulse signal from the oscillator and the output signal from the first self hold circuit; and a first logical sum operation circuit for carrying out a logical sum operation on the logical product output from the logical product operation circuit, and the pulse signal of the signal being counted, and inputting the logical sum output to the pulse counting device.

Moreover, a different construction for the signal switching device may comprise: an oscillator for generating the high frequency pulse signal; a transistor for switching the output signal from the first self hold circuit using the high frequency pulse signal from the oscillator; a photocoupler for generating an AC output synchronously with the switching operation of the transistor; and a second logical sum operation circuit for carrying out a logical sum operation on the AC output from the photocoupler and the pulse signal of the signal being counted, and inputting the logical sum output to the pulse counting device.

Furthermore, another different construction for the signal switching device may comprise: an oscillator for generating the high frequency pulse signal, with the output signal from the first self hold circuit as a drive power source; and a third logical sum operation circuit for carrying out a logical sum operation on the high frequency pulse signal from the oscillator and a pulse signal of the signal being counted, and inputting the logical sum output to the pulse counting device.

With such a construction, since the oscillator is driven so that a high frequency pulse signal is input to the pulse counting device, only during the period when the first self hold circuit is generating an output signal, then the construction of the signal switching device can be simplified.

The counting apparatus according to a second aspect of the invention comprises: a pulse counting device made up of a plurality of frequency dividing circuits connected in cascade, for counting the number of inputs of a pulse signal of a signal being counted once all of the dividing circuits have been preset by the input of a preset signal, and generating an output when this reaches a predetermined value; a reset verification device for verifying after input of the preset signal, that the output from the pulse counting device has been reset, and then generating a reset verification signal; and an output generating device for generating an effective counting result output based on the output generated from the pulse counting device, under the proviso that the reset verification signal has been generated from the reset verification device.

With such a construction, since an effective counting result output is only generated from the output generating device when a reset verification signal is generated from the reset verification device, then the reset of the pulse counting device can be accurately verified. Moreover, the generation of the counting result is not earlier than a predetermined generation period.

Basically, the reset verification device comprises: a fall detection circuit which detects a fall in the output from the pulse counting device and generates a fall detection signal; and a second self hold circuit with the fall detection signal input to a trigger terminal, and a signal generated in synchronous with the preset signal input to a hold terminal, for generating an output signal when the respective signals are input together to the two terminals and feeding this back to the trigger terminal to self hold the output signal as the reset verification signal. Moreover, the output generating device comprises: a first rise detection circuit for detecting a rise in the output from the pulse counting device and generating a rise detection signal; and a third self hold circuit with the rise detection signal input to a trigger terminal, and the reset verification signal of the second self hold circuit input to a hold terminal, for generating an output signal when the respective signals are input together to the two terminals and feeding this back to the trigger terminal to self hold the output signal as the counting result output.

Moreover, the respective frequency dividing circuits of the pulse counting device may be flip-flop circuits having a first output terminal and a second output terminal with a mutually complementary output relationship, the flip flop circuits being constructed such that an output condition of the second output terminal which is fed back to an input side of the flip-flop circuit is stored by the input of a pulse signal from an earlier stage side, and transmitted from the first output terminal to a latter stage side. Furthermore, the reset verification device may comprise: a second rise detection circuit for detecting a rise in the output from the second output terminal of the flip-flop circuit, and generating a rise detection signal superimposed with a predetermined potential; and a fourth self hold circuit with the rise detection signal from the second rise detection circuit input to a trigger terminal, and a signal generated in synchronous with the preset signal input to a hold terminal, for generating an output signal when signals of a higher level than the predetermined potential are input together to the two terminals, and feeding this back to the trigger terminal to self hold the output signal as the reset verification signal, and which does not generate an output signal at the time of a fault. Moreover, the output generating device may comprise: a third rise detection circuit for detecting a rise in the output from the first output terminal of the flip-flop circuit and generating a rise detection signal superimposed with a predetermined potential; and a fifth self hold circuit with the rise detection signal from the third rise detection circuit input to a trigger terminal, and the reset verification signal from the fourth self hold circuit input to a hold terminal, for generating an output signal when signals of a higher level than the predetermined potential are input together to the two terminals, and feeding this back to the trigger terminal to self hold the output signal as the count result output, and which does not generate an output signal at the time of a fault.

With such a construction, since the fall detection circuit which is difficult to make fail-safe need not be used, then the fail-safe characteristics of the counting apparatus can be improved.

Moreover, the fourth and fifth self hold circuits may comprise fail-safe logical product operation circuits which generate an AC output when input signals of a higher potential than a predetermined level are input together to the two input terminals, and which do not generate an AC output at the time of a fault, the construction being such that one of the input terminals of the fail-safe logical product operation circuit is a trigger terminal and the other input terminal is a hold terminal, and the AC output is rectified by a voltage doubler rectifying circuit and fed back to the trigger terminal via a feed back resistor.

Moreover, the construction may incorporate a frequency discriminating circuit which generates an output signal only when the output from the pulse counting device is a predetermined frequency.

With such a construction it is also possible to monitor for normalcy of the counting operation of the pulse counting device.

The rotation stopped detection apparatus according to a third aspect of the invention, is one wherein a rotation stopped condition of a rotation body is detected using the counting apparatus according to the first aspect of the invention, the construction being such that the pulse generation frequency of a rotation detection signal of a rotation sensor which generates a rotation detection signal with a pulse interval which changes corresponding to the rotation speed of the rotation body, is measured by the counting apparatus, and when the pulse generation frequency is equal to or less than a predetermined frequency, a judgment signal indicating a rotation stopped condition is generated from the counting apparatus.

With such a construction, the pulse generation frequency of the rotation detection signal from the rotation sensor is measured while the counting operation of the counting apparatus is being monitored for normalcy, and if the pulse generation frequency is equal to or less than a predetermined frequency set beforehand, a rotation stopped condition of the rotation body is judged. Hence reliability of the rotation stopped detection can be improved.

The construction may be such that, for measuring the pulse generation frequency, the pulse interval of the rotation detection signal is measured with the counting apparatus, and when the pulse interval is equal to or greater than a set time, and the pulse generation frequency is thus equal to or less than a predetermined frequency, a judgment output indicating a rotation stopped condition is generated from the counting apparatus.

Furthermore, the construction may be such the pulse counting device of the counting apparatus is reset with each input of the rotation detection signal, and also a timing clock signal is input to the pulse counting device via the signal switching device, and when the set time is counted, an output is generated from the pulse counting device, and when the output is generated from the pulse counting device, the signal switching device is controlled by the control device so that a high frequency pulse signal is input to the pulse counting device, and a judgment output indicating the rotation stopped condition is generated from the frequency discriminating device.

With such a construction, the reliability of the counting results of the counting apparatus can be improved.

Moreover, for the measuring of the pulse generation frequency, the construction may be such that the number of pulse generations of the rotation detection signal per predetermined time is measured by the counting apparatus, and when the number of pulse generations [per predetermined time] is less than a predetermined number, and the pulse generation frequency is thus equal to or less than a predetermined frequency, a judgment output indicating the rotation stopped condition is generated from the counting apparatus.

The construction may be such that the rotation detection signal is input to the pulse counting device of the counting apparatus via the signal switching device, and when the number of pulse generations of the rotation detection signal reaches the predetermined number, an output is generated from the pulse counting device. Moreover, there may be provided a time measuring device which, when reset synchronously with the output from the pulse counting device, outputs a reset signal to the pulse counting device, and which starts measurement of the predetermined time synchronized with the counting commencement of the pulse counting device, and generates an output when the predetermined time has lapsed, and when the output from the time measuring device is generated during a counting operation of the pulse counting device, the signal switching device is controlled by the control device so that a high frequency pulse signal is input to the pulse counting device, and a judgment output indicating the rotation stopped condition is generated from the frequency discriminating device.

BEST MODE FOR CARRYING OUT THE INVENTION

As follows is a description of embodiments of counting apparatuses according to a first aspect of the invention, with reference to the drawings.

Figure 1:
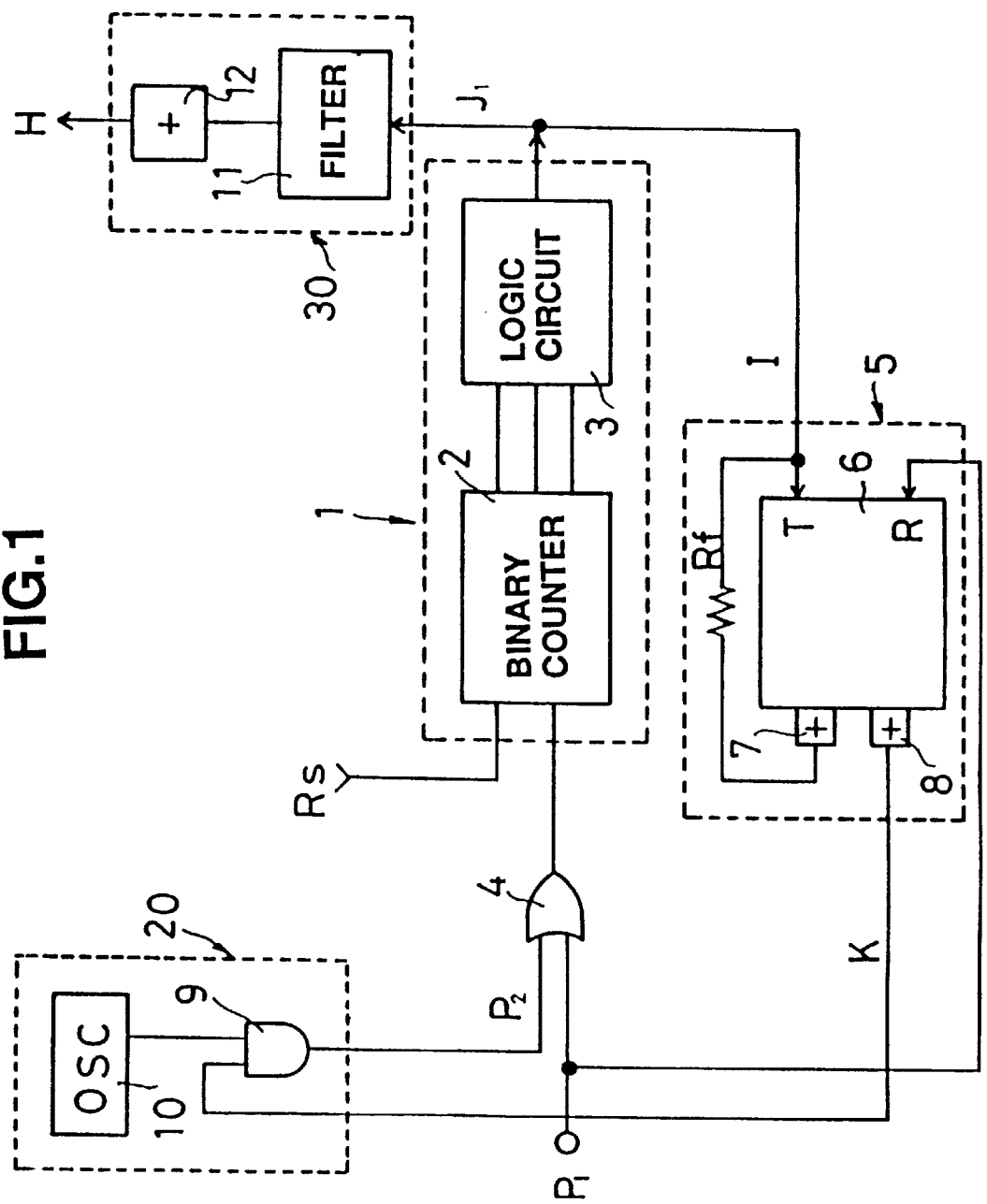
FIG. 1 is a circuit diagram of a first embodiment of a counting apparatus according to a first aspect of the invention.

FIG. 1 shows a circuit configuration of a first embodiment of a counting apparatus according to the first aspect of the invention.

In FIG. 1, a counter 1 serving as a pulse counting device for counting a low frequency pulse signal P1, being the signal to be counted, comprises a binary counter 2 and a logic circuit 3. When the pulse signal P1 is input to the binary counter 2 via an OR gate 4 serving as a first logical sum operation circuit, the binary counter 2 counts the number of inputs of the pulse signal P1 and inputs a count signal indicating the count number to the logic circuit 3. Then each time the count signal from the binary counter 2 reaches a predetermined number, the logic circuit 3 inputs an output signal I to a trigger terminal T of a self hold circuit 5.

The self hold circuit 5 comprises an AND gate 6, rectifying circuits 7, 8, and a feedback resistor Rf, with the pulse signal P1 input to a hold terminal R, and is reset by a falling edge of the pulse signal P1. When the pulse signal P1 is in a high level condition, the self hold circuit 5 is triggered by the input of the output signal I from the counter 1, so that the AND gate 6 produces an AC signal. This AC signal is rectified by the rectifying circuit 7 and fed back to the trigger terminal T via the feedback resistor Rf to thereby self hold the AC signal from the AND gate 6. The self hold circuit 5 is of a fail-safe construction such that an output signal is not produced at the time of a fault. This type of fail-safe self hold circuit is constructed using a fail-safe AND gate comprising a plurality of resistors and transistors, and is known for example from U.S. Pat. Nos. 4,757,417, 5,027,114, and International Patent Publication Nos. WO94/23303, and WO94/23496.

With the self hold circuit 5, the AC signal from the AND gate 6 is rectified by the other rectifying circuit 8, and input as an output signal K to one input terminal of an AND gate 9 serving as a logical product operation circuit. An oscillation output from an oscillator 10 of a frequency which is higher than that of the pulse signal P1 is input to the other input terminal of the AND gate 9. Consequently, with the AND gate 9, when the output signal K from the self hold circuit 5 is input thereto, a high frequency pulse signal P2 corresponding to the oscillation output from the oscillator 10, is input via the OR gate 4, to the binary counter 2 of the counter 1. Here the self hold circuit 5 corresponds to a first self hold circuit, and constitutes a control device. Moreover, a signal switching device is made up of the OR gate 4 and a high frequency pulse signal generating circuit 20 comprising the oscillator 10 and the AND gate 9.

The counter 1 counts the high frequency pulse signals P2 from the AND gate 9, and generates an output signal each time a predetermined number is reached That is to say, a dividing signal $J_1$ which divides the high frequency pulse signals P2 input via the AND gate 9, is generated from the counter 1. This dividing signal $J_1$ for the counter 1, is input to a filter circuit 11 comprising a band-pass filter. The filter circuit 11 only passes the input dividing signal $J_1$ only when this is at a predetermined frequency, and inputs this to a rectifying circuit 12. Consequently, a judgment signal H for indicating the normalcy of the counter, is only generated when the dividing signal $J_1$ is at a predetermined frequency, thus indicating that the counting operation of the counter 1 is normal. Here a frequency discriminating circuit 30 serving as a frequency discriminating device is made up of the filter circuit 1 1 and the rectifying circuit 12.

The AND gate 9 has the same construction as the beforementioned fail-safe AND gate 6 used in the self hold circuit, and is known for example from U.S. Pat. No. 4,661,880, and International Patent Publication Nos. WO94/23303, and WO94/23496.

Figure 2:
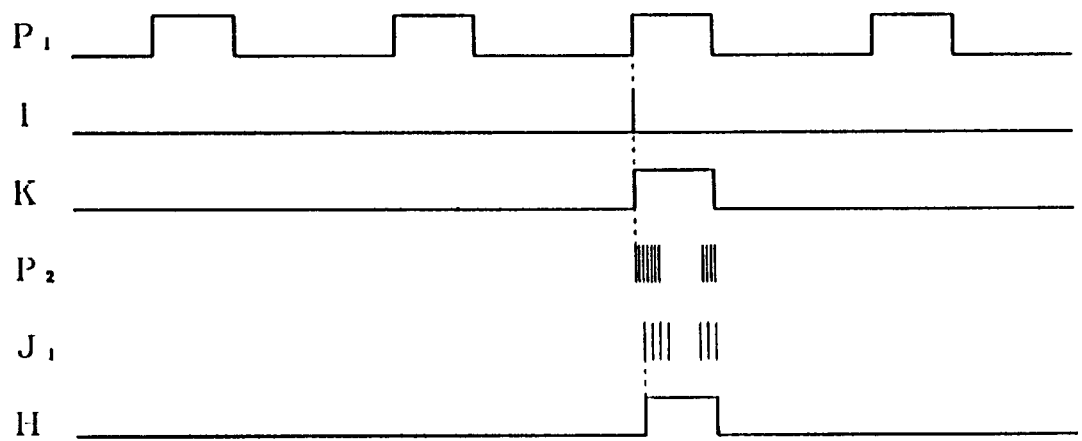
FIG. 2 is a time chart of output signals from respective circuits of FIG. 1.

Next is a description of the operation with reference to FIG. 2 which shows a time chart for the output timing of output signals from the respective circuits.

The pulse signal P1 for the signal being counted, as shown in FIG. 2, is input via the OR gate 4 to the binary counter 2 which has been reset beforehand by a reset signal Rs, and a count signal corresponding to the number of inputs is input from the binary counter 2 to the logic circuit 3. When the number of inputs of the pulse signal P1 reaches a predetermined count number, the output signal I is generated from the logic circuit 3 and input to the trigger terminal T of the self hold circuit 5.

With the self hold circuit 5, the pulse signal P1 is input to the hold terminal R and when the output signal I from the logic circuit 3 is input, a high level signal for the pulse signal P1 is input. Consequently, due to the input of the output signal I, the AND gate 6 of the self hold circuit 5 generates an AC signal, and the rectified output from the rectifying circuit 7 is fed back to the trigger terminal side via the feedback resistor Rf so that the AC signal from the AND gate 6 is self held. As a result, an output signal K is input from the self hold circuit 5 via the rectifying circuit 8, to one of the input terminals of the AND gate 9 of the high frequency pulse signal generating circuit 20.

With the high frequency pulse signal generating circuit 20, due to the input of the output signal K from the self hold circuit 5, the high frequency signal output from the oscillator 10 is output via the AND gate 9, and is input to the binary counter 2 via the OR-gate 4, as a high frequency pulse signal P2 as shown in FIG. 2. The binary counter 2 counts the number of high frequency pulse signals P2, and generates a dividing signal $J_1$ from the logic circuit 3 each time the count value reaches a predetermined value. Consequently, the dividing signal $J_1$ as shown in FIG. 2, is one where the high frequency pulse signal P2 has been frequency divided.

The dividing signal $J_1$ is input to the filter circuit 11 of the frequency discriminating circuit 30. The filter circuit 11 passes the dividing signal J1 only when this is at a predetermined frequency. A judgment signal H which has been rectified by the rectifying circuit 12 is then produced, showing that the counting operation of the counter 1 is normal. The dividing signal $J_1$ from the counter 1 is generated over the period of the pulse width of the pulse signal P1. The self hold circuit 5 is then reset by the falling edge of the pulse signal P1, so that the pulse signal P2 from the high frequency pulse signal generating circuit 20 stops, and once again the pulse signal P1 is input to the binary counter 2 via the OR gate 4, and the counting operation for the pulse signal P1 starts.

With such a construction, after a counting operation for the pulse signal P1 of the signal being counted, the binary counter 2 is made to carry out a high speed counting operation using the high frequency pulse signal P2, this enabling monitoring for whether or not the counting operation of the binary counter 2 is normal. Since the counting operation for the monitoring is carried out for each completion of the pulse signal P1 count, the reliability of the count value of the counter 1 can be considerably increased. Consequently, the accuracy and reliability of a timer or delay circuit or the like which uses such a counting operation in a counting apparatus can be considerably increased.

For the processing of the count output from the counter 1, if for example the judgment signal H for indicating that the counter 1 is normal, is generated from the frequency discriminating circuit 30, then the count output at that time can be effective for showing that the count output from the counter 1 is the correct value.

Figure 3:
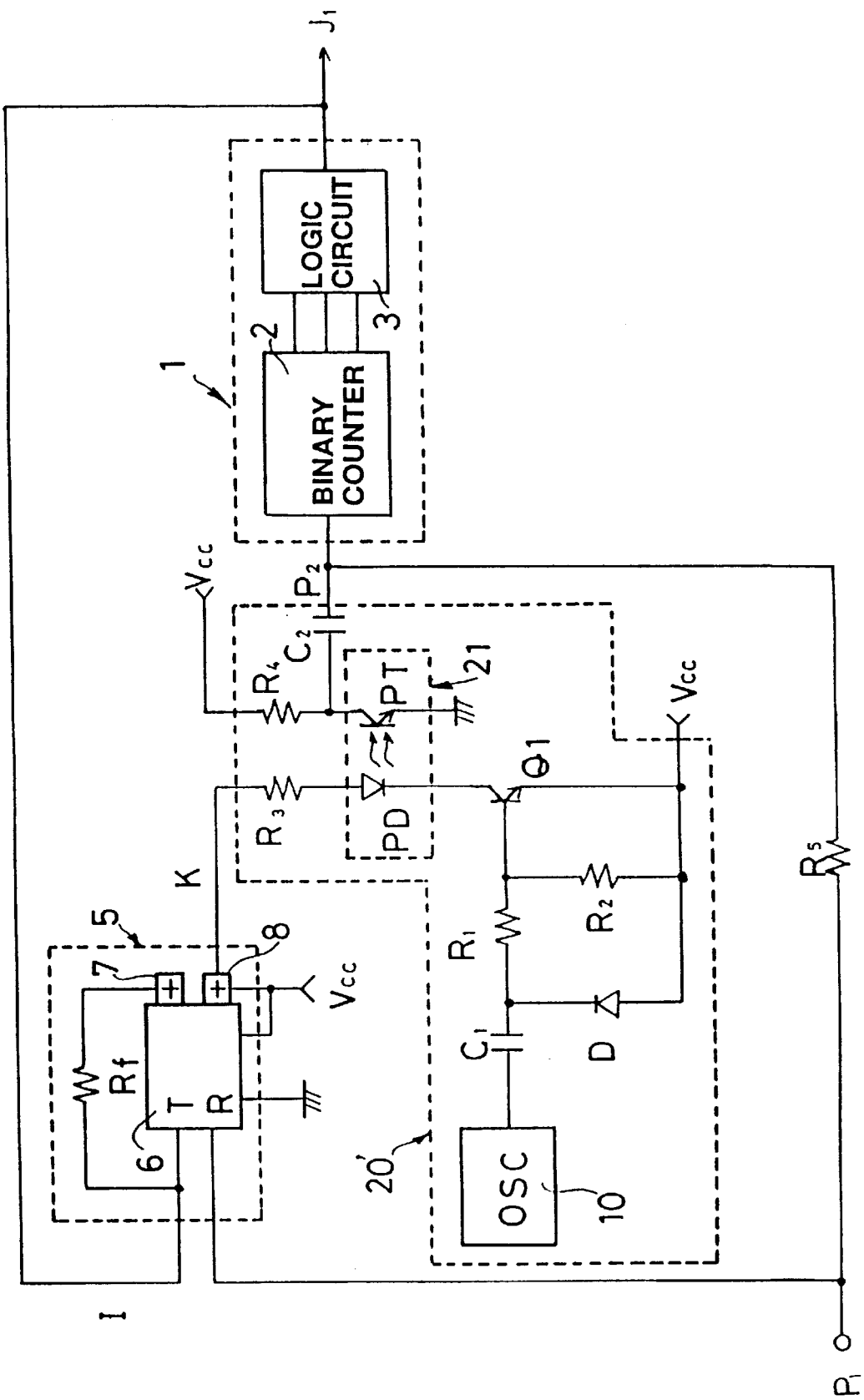
FIG. 3 is a principal circuit diagram of a second embodiment.

Next is a description of a second embodiment shown in FIG. 3.

This embodiment is an example of where a photocoupler is used in the high frequency pulse signal generating circuit. Elements the same as for the first embodiment of FIG. 1 are indicated by the same symbols and description is omitted.

In FIG. 3, with a high frequency pulse signal generating circuit 20' of this embodiment, a high frequency signal from an oscillator 10 is input to the base of a transistor Q1 via a coupling capacitor C1 and a base resistor R1. Symbol R2 indicates a base resistor while symbol D indicates a clamping diode for clamping the high frequency signal from the oscillator 10 at the power source potential Vcc. With the transistor Q1, the collector side is connected to an output terminal of a self hold circuit 5, while the power source potential Vcc is applied to the emitter side. A reducing resistor R3 and a photodiode PD of a photocoupler 21 are connected in series between the output terminal of the self hold circuit 5 and the collector of the transistor Q1. A light receiving phototransistor PT positioned facing the photodiode PD, has the power source potential Vcc applied to the collector side via a reducing resistor R4, and the emitter side connected to earth. The light received output from the phototransistor PT is output as a high frequency pulse signal P2 via the coupling capacitor C2. A pulse signal P1 and the high frequency pulse signal P2 from the high frequency pulse signal generating circuit 20' are then wired OR connected and input to a binary counter 2. Here the wired OR connection portion corresponds to a second logical sum operation circuit.

Next is a description of the operation.

The operation up until the number of inputs of the pulse signal P1 input via the resistor R5 reaches a predetermined number and an output signal I is generated from a counter 1, and an output signal K is generated from the self hold circuit 5, is similar to that of the first embodiment of FIG. 1. The oscillator 10 makes the transistor Q1 switch at the oscillation frequency thereof, and hence when the output signal K which is superimposed with the power source potential Vcc is generated from the self hold circuit 5, then due to the switching operation of the transistor Q1, the photodiode PD of the photocoupler 21 emits light corresponding to the oscillation frequency of the oscillator 10. The phototransistor PT receives this light emission, and a high frequency pulse signal P2 based on the light received output, is input to the binary counter 2. After this, as with the first embodiment, the normalcy of counter 1 based on the dividing signal J1 for the high frequency pulse signal P2, is judged by the presence of a judgment signal H from the frequency discriminating circuit 30 shown in FIG. 1.

With the high frequency pulse signal generating circuit 20' of the present embodiment, since the emitter side of the transistor Q1 is clamped at the power source potential Vcc, then if an output voltage is not produced in the rectifying circuit 8 of the self hold circuit 5, the oscillation output from the oscillator 10 will not be transmitted to the counter 1 side via the photocoupler 21.

Figure 4:
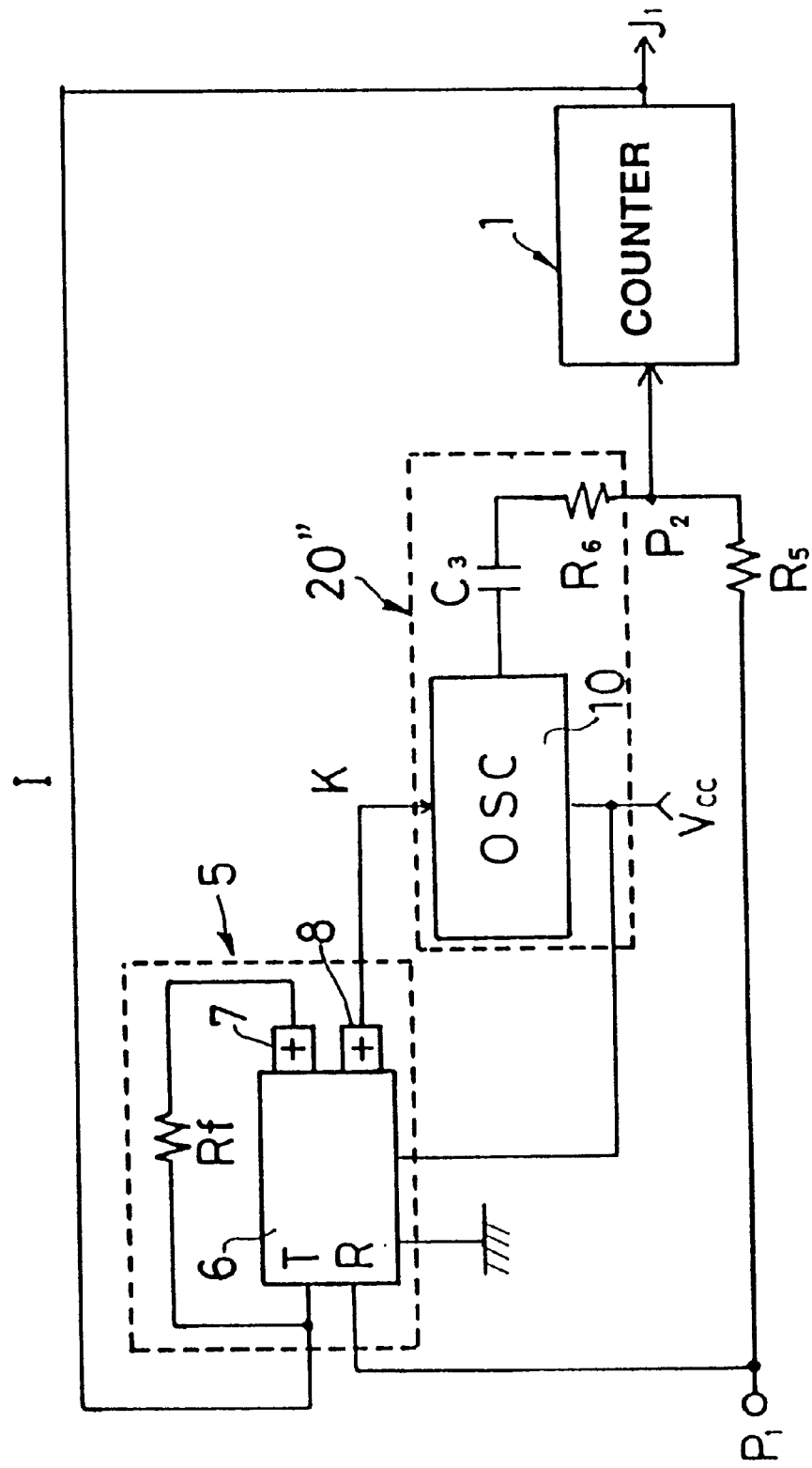
FIG. 4 is a principal circuit diagram of a third embodiment.

Next is a description of a third embodiment as shown in FIG. 4. Elements the same as for the first embodiment are indicated by the same symbols and description is omitted.

In FIG. 4, with a high frequency pulse signal generating circuit 20" of this embodiment, the construction involves using an output signal K from a self hold circuit 5 as a drive power source for an oscillator 10. A high frequency signal from the oscillator 10 is output as a high frequency pulse signal P2 from the high frequency pulse signal generating circuit 20" via a coupling capacitor C3 and a resistor R6. A pulse signal P1 and the high frequency pulse signal P2 are wired OR connected, and input to a binary counter 2 of a counter 1. Here the wired OR connection portion corresponds to a third logical sum operation circuit.

Next is a description of the operation.

The operation up until the number of inputs of the pulse signal P1 reaches a predetermined number and an output signal I is generated from the counter 1, and the output signal K is generated from the self hold circuit 5, is similar to that of the first embodiment of FIG. 1. When the output signal K is generated from the self hold circuit 5 and input to the oscillator 10, the oscillator 10 is driven and a high frequency signal thus produced, so that the high frequency pulse signal P2 from the high frequency pulse signal generating circuit 20" is produced and input to the binary counter 2 of the counter 1. After this, as with the first embodiment, the normalcy of the counter 1 based on the dividing signal J1 for the high frequency pulse signal P2, is judged by the presence of the judgment signal H from the frequency discriminating circuit 30 shown in FIG. 1

With such a construction, since the oscillator 10 is driven and the high frequency pulse signal P2 produced only when the output signal K from the self hold circuit 5 is produced, then the AND gate 9 of FIG. 1 can be omitted. Hence the circuit construction of the high frequency pulse signal generating circuit 20" can be simplified.

With the counting apparatuses according to the first aspect of the invention as described above, the construction is such that the counting operation of the counter is monitored for normalcy after completion of the counting operation for the pulse signals of the signal being counted. Hence the reliability of the counting apparatus can be even further increased. Moreover, since the high speed counting operation for the monitoring is carried out successively on completion of each round of counting operations, the reliability of the monitoring results for the normalcy of the counting apparatus is high.

Furthermore, if the construction is such that, the output from the self hold circuit is made the drive power source for the oscillator of the high frequency signal generating circuit, then the construction of the high frequency pulse signal generating circuit can be simplified.

Next is a description of embodiments of counting apparatuses according to a second aspect of the invention.

Figure 5:
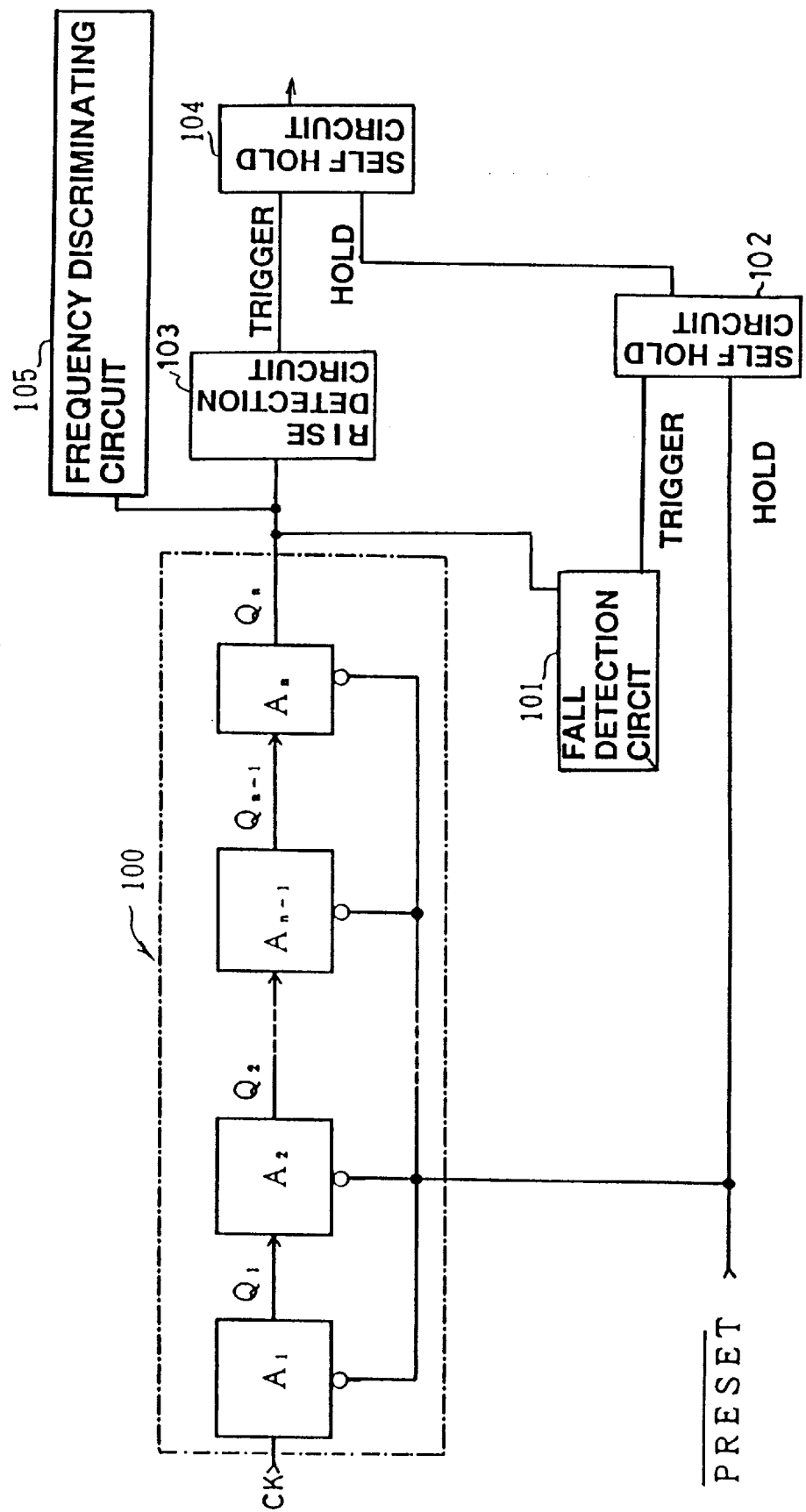
FIG. 5 is a circuit diagram of a first embodiment of a counting apparatus according to a second aspect of the invention.

FIG. 5 shows the circuit configuration of a first embodiment of a counting apparatus according to the second aspect of the invention.

In FIG. 5, a counter 100, serving as a pulse counting means, comprises for example n frequency dividing circuits, i.e. flip flop circuits (referred to hereunder as F•F circuits) $A_1, A_2 \ldots A_{n-1}, A_n$, connected in cascade. With the F$\Sigma$F circuits $A_1, A_2 \ldots A_{n-1}, A_n$, when a preset signal $\overline{\text{PRESET}}$ of an L level is input to an active low preset terminal, a set condition results (the Q terminal output becomes an H level), while when the preset signal $\overline{\text{PRESET}}$ rises to an H level, the preset condition is released and the counting operation of an input clock signal CK starts.

Figure 6:
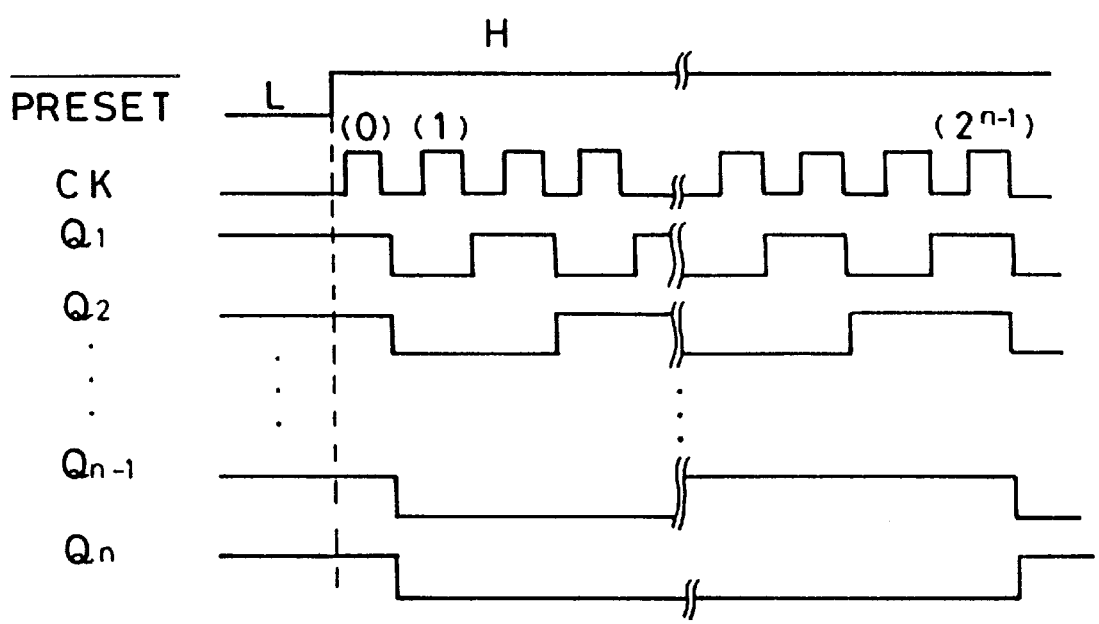
FIG. 6 is an operation time chart for a counter of FIG. 5.

With the counter 100 of this embodiment, as shown in FIG. 6, once the preset signal $\overline{\text{PRESET}}$ has risen, then with the falling of the initial clock signal CK (shown as (0) in FIG. 6), at first an output Q1 from the frequency dividing circuit $A_1$ falls, after which an output Q2 from the frequency dividing circuit $A_2$ falls, and so on, the outputs from the successive frequency dividing circuits dropping until finally an output $Q_n$ from the frequency dividing circuit $A_n$ falls, thus resetting the counter 100. After this, the counter 100 continues the counting operation of the clock signal CK, and as shown in FIG. 6, the output $Q_n$ from the last stage frequency dividing circuit $A_n$ rises with the falling of the $2^{-1}$th clock signal CK following reset. Consequently, the counter 100 generates an output $Q_n$ when $(2^{n-1}+1)$ clock signals CK have been counted.

The output $Q_n$ from the counter 100 is input to a fall detection circuit 101. The fall detection circuit 101 comprises for example a NOT operation circuit and a differentiating circuit. With the fall detection circuit 101, the output $Q_n$ from the counter 100 is subjected to a NOT operation by the NOT operation circuit, after which it is differentiated by the differentiating circuit and the differentiated signal then input to the trigger terminal of a self hold circuit 102, serving as a second self hold circuit. The preset signal $\overline{\text{PRESET}}$ is input to the hold terminal of the self hold circuit 102.

The self hold circuit 102 generates an output when signals are input to both the trigger terminal and the hold terminal, and feeds this output back to the trigger terminal to self hold the output. With the self hold circuit 102, an output is produced when, after the preset signal $\overline{\text{PRESET}}$ has reached the H level and the counting operation of the counter 100 started, the last stage frequency dividing circuit $A_n$ is reset and the output $Q_n$ starts to fall. Consequently, the output from the self hold circuit 102 is not generated until the counter 100 is in the reset condition, and is thus generated as a reset verification signal. Here a reset verification device is made up of the fall detection circuit 101 and the self hold circuit 102.

The output $Q_n$ from the counter 100 is also input to a rise detection circuit 103, serving as a first rise detection circuit. The rise detection circuit 103 comprises for example a differentiating circuit. With the rise detection circuit 103, the output $Q_n$ from the counter 100 is differentiated by the differentiating circuit, and then input to the trigger terminal of a self hold circuit 104, serving as a third self hold circuit. The reset verification signal from the self hold circuit 102 is input to the hold terminal of the self hold circuit 104.

The self hold circuit 104 generates an output when signals are input to both the trigger terminal and the hold terminal, and feeds back this output to the trigger terminal to self hold the output. Consequently, with the self hold circuit 104, when an output $Q_n$ is generated from the counter 100, then under the proviso that the reset verification signal has been generated, this output is stored and output as an effective counting result output. Here an output generating device is made up of the rise detection circuit 103 and the self hold circuit 104.

Next is a description of the operation of the counting apparatus of FIG. 5.

When the preset signal $\overline{\text{PRESET}}$ is an L level, the respective frequency dividing circuits $A_1, A_2 \ldots A_{n-1}, A_n$ of the counter 100 are preset and the respective outputs $Q1, Q_2 \ldots Q_{n-1}, Q_n$ rise to the set condition. Then, when the preset signal $\overline{\text{PRESET}}$ becomes an H level, the counting operation is started, and with the input of the initial clock signal CK, all of the frequency dividing circuits $A_1, A_2 \ldots A_{n-1}, A_n$ are successively reset so that the respective outputs $Q_1, Q_2 \ldots Q_{n-1}, Q_n$ fall. When the output $Q_n$ falls, a signal from the fall detection circuit 101 is input to the trigger terminal of the self hold circuit 102. Since a signal of H level has already been input to the hold terminal of the self hold circuit 102 with the rising of the preset signal $\overline{\text{PRESET}}$, then due to the input signal to the trigger terminal, a reset verification signal is generated from the self hold circuit 102 and input to the hold terminal of the next stage self hold circuit 104.

After this, when the $(2^{n-1}+1)$ clock signals CK have been input to the counter 100, the output $Q_{n-1}$ from the frequency dividing circuit $A_{n-1}$ falls so that the output $Q_n$ from the final stage frequency dividing circuit $A_n$ rises and an output is thus produced from the counter 100. The output from the counter 100 is detected by the rise detection circuit 103 and input to the trigger terminal of the self hold circuit 104. Since a reset verification signal is already being input to the hold terminal of the self hold circuit 104, an output is generated from the self hold circuit 104 and self held, so that the output $Q_n$ from the counter 100 is stored and an effective count result output is produced.

Consequently, in the case where the counter 100 is reset normally, then when the previously set predetermined $(2^{n-1}+1)$ clock signals CK have been input, an output is generated from the self hold circuit 104.

With the circuit of the present embodiment, if the preset signal input line for the n−1th frequency dividing circuit $A_{n-1}$ becomes disconnected so that the frequency dividing circuit $A_{n-1}$ is not preset, then the reset operation due to the first clock signal CK stops at the frequency dividing circuit $A_{n-1}$. That is to say, the frequency dividing circuit $A_{n-1}$ is set at this time so that the output $Q_{n-1}$ rises. The resetting of the frequency dividing circuit $A_{n-1}$ is then not until the $2^{n-2}$ clock signals CK have been input once more. Consequently, the resetting of the output $Q_n$ from the frequency dividing circuit $A_n$ is further delayed so that the generation of an output from the counter 100 is later than normal.

Even in a worst case scenario where all of the preset signal input lines for the frequency dividing circuits $A_1$, $A_2 \ldots A_{n-1}, A_n$ become disconnected so that the counter 100 is operated with no relation to the preset signal $\overline{\text{PRESET}}$, when the preset signal $\overline{\text{PRESET}}$ is a falling (L level) the reset verification signal is not generated and hence an output is not generated from the self hold circuit 104. This case exists in the condition of the counter 100 at the time of rising of the preset signal $\overline{\text{PRESET}}$. If after all of the frequency dividing circuits $A_1, A_2 \ldots A_{n-1}, A_n$ have been reset, the preset signal $\overline{\text{PRESET}}$ rises, then the falling of the output $Q_n$ from the counter 100 must wait for the input of the $2^n$ clock signals CK. Hence the generation of an output from the self hold circuit 104 is later than normal.

When for example, the circuit of this embodiment is applied to an on-delay timer, the preset signal $\overline{\text{PRESET}}$ can be substituted for the input signal to be delayed.

When the input signal is not input, the preset terminal of the counter 100 is at an L level and the counter 100 is in the preset condition. On input of the input signal, the preset terminal of the counter 100 becomes an H level, so that the counter 100 is reset and the counting operation starts. When a predetermined number of clock signals CK have been input, an output is produced from the self hold circuit 104, and this output is held as long as an input signal is being input. Consequently this gives an on-delay timer wherein an output is produced after a predetermined time delay from input of an input signal.

Therefore, in this case, even if as mentioned above, a disconnection fault occurs in the preset signal input line of the counter 100, the generation of an output from the self hold circuit 104, that is to say the generation of an on-delay timer output is never premature. Fail-safe count performance is thus satisfied, and hence an on-delay timer with excellent fail-safe characteristics can be provided.

In the case where a fault which fixes the output, occurs in any one of the respective frequency dividing circuits $A_1$, $A_2 \ldots A_{n-1}, A_n$, or a short circuit fault occurs between the input and output, the output from the self hold circuit 104 could be premature.

In the case where this type of fault in the frequency dividing circuit itself is also to be considered, then as shown in FIG. 5, a frequency discriminating circuit 105 may be provided for discriminating the frequency of the output $Q_n$ from the counter 100. The frequency discriminating circuit 105, as with the frequency discriminating circuit 30 shown in FIG. 1, is made up of a filter circuit comprising a band-pass filter which only passes an input signal of a predetermined frequency, and a rectifying circuit for rectifying the signal passed by the filter circuit.

In the case where the abovementioned fault occurs in the frequency dividing circuit itself, then the frequency of the output $Q_n$ from the counter 100 differs from the predetermined frequency corresponding to the previously set count value of the counter 100, and hence an output is not produced from the frequency discriminating circuit 105. Moreover since also in the case where the preset terminal and the output terminal of any of the frequency dividing circuits becomes short circuited, the output $Q_n$ from the counter 100 becomes fixed, then there is no output from the frequency discriminating circuit 105.

Consequently, the output from the self hold circuit 104 and the output from the frequency discriminating circuit 105 can be subjected to a logical product operation by a logical product operation circuit, and the output from this logical product operation circuit then made the final effective output. If this is done, then for example when applied to an on-delay timer, if for example the frequency dividing circuit itself has a fault, a timer output is not generated. Furthermore, also in the case where the preset signal input line has a disconnection fault, the timer output is delayed but is never premature. Consequently an on-delay timer of excellent fail-safe characteristics can be realized.

However, in the case of the circuit of FIG. 5, since the fall detection circuit 101 includes a NOT operation circuit, then there is the possibility of an erroneous output being generated due to a disconnection fault or the like in the input line to the NOT operation circuit. In this case, there is thus the problem that a reset verification signal is generated from the self hold circuit 102.

Figure 7:
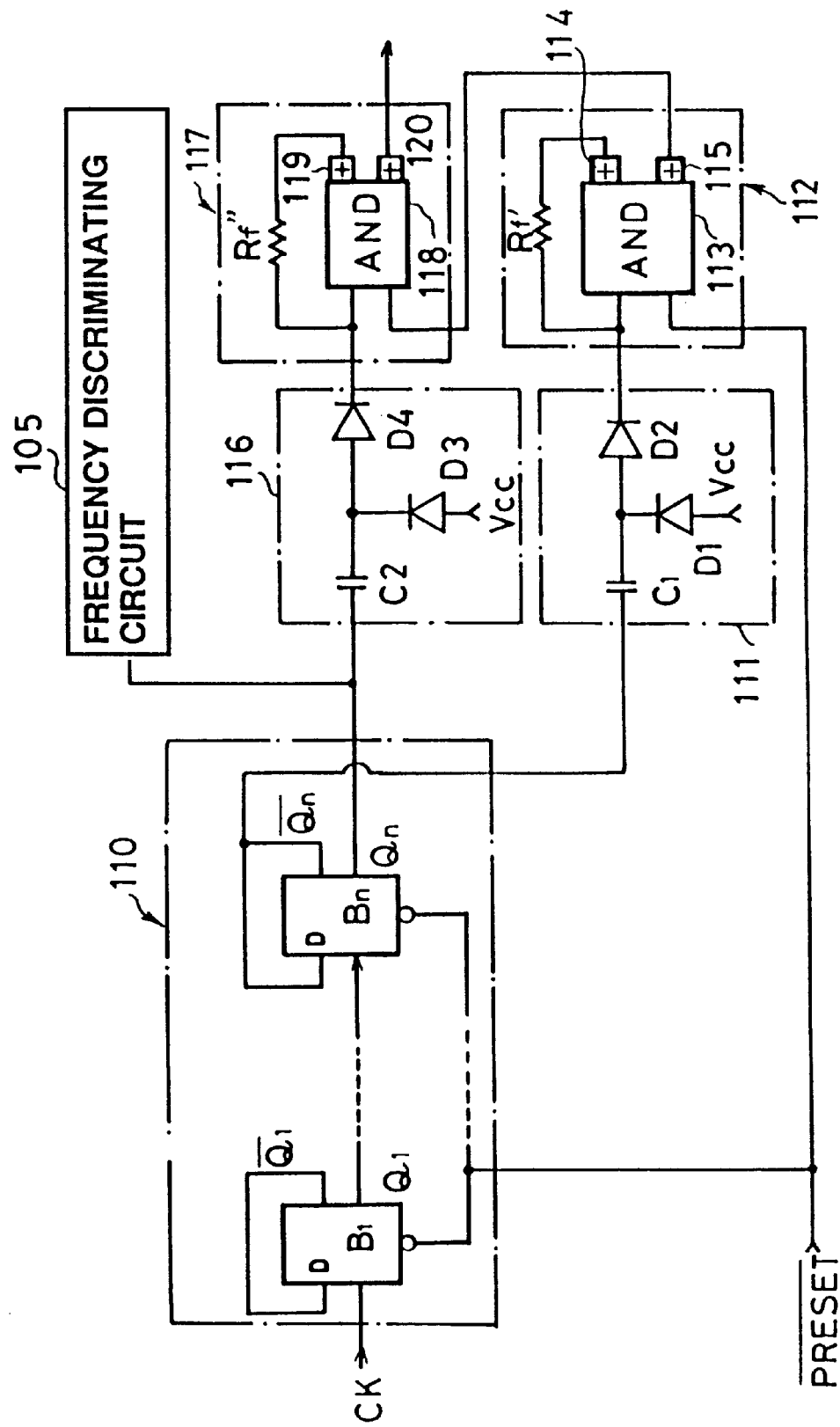
FIG. 7 is a circuit diagram of a second embodiment.

FIG. 7 shows a circuit configuration of a second embodiment which solves the above problem.

In FIG. 7, a counter 110 of this second embodiment comprises for example n frequency dividing circuits, i.e. D-flip flop circuits (referred to hereunder as D-F•F circuits) $B_1 \ldots B_n$ with output relationships such that an output from a $\overline{Q}$ terminal, serving as a second output terminal which has a mutually complementary relationship with a Q terminal, serving as a first output terminal, is fed back to a data terminal (referred to hereunder as a D terminal), connected in cascade.

With these D-F•F circuits $B_1 \ldots B_n$, when a preset signal $\overline{\text{PRESET}}$ of an L level is input to an active low preset terminal, a set condition results (the Q terminal output becomes an H level while the $\overline{\text{PRESET}}$ terminal output becomes an L level), while when the preset signal $\overline{\text{PRESET}}$ rises to an H level, the preset condition is released and the counting operation of the input clock signal CK starts. With the counter 110, once the preset signal $\overline{\text{PRESET}}$ has risen, the counter 110 is reset with the falling of the initial clock signal CK, while when the $(2^{n-1}+1)$ clock signals CK have been counted, the output $Q_n$ rises and the output $\overline{Qn}$ falls.

The output $\overline{Qn}$ from the counter 110 is input to a rise detection circuit 111, serving as a second rise detection circuit. The rise detection circuit 111 is a differentiating circuit comprising a capacitor C1 and diodes D1, D2. The rise detection circuit 111 differentiates the rising of the output $\overline{Qn}$ from the counter 110, and the differentiated signal is superimposed with the power source potential Vcc by means of the diode D1, and input to a trigger terminal of a self hold circuit 112, serving as a fourth self hold circuit. The preset signal $\overline{\text{PRESET}}$ is input to the hold terminal of the self hold circuit 112.

The self hold circuit 112 comprises an AND gate 113, rectifying circuits 114, 115, and a feedback resistor Rf'. When the preset signal $\overline{\text{PRESET}}$ is at an H level, then when the differentiated signal which has been superimposed by the power source potential Vcc is input, the AND gate 113 generates an AC signal thus giving self holding. This self hold circuit 112 has the same construction as the self hold circuit 5 shown in FIG. 1, being a known fail-safe self hold circuit which does not generate an output signal at the time of a fault. Here the reset verification device of this embodiment comprises the rise detection circuit 111 and the self hold circuit 112.

The output $Q_n$ from the counter 110 is input to a rise detection circuit 116, serving as a third rise detection circuit. The rise detection circuit 116 is a differentiating circuit comprising a capacitor C2 and diodes D3, D4. The differentiated signal is superimposed with the power source potential Vcc by means of the diode D3, and then input to a trigger terminal of a self hold circuit 117, serving as a fifth self hold circuit.

The self hold circuit 117 comprises an AND gate 118, rectifying circuits 119, 120, and a feedback resistor Rf", and has a fail-safe construction the same as the self hold circuit 112. Here the output generating device comprises the rise detection circuit 116 and the self hold circuit 117.

Next is a description of the operation of the counting apparatus of FIG. 7.

When the preset signal $\overline{\text{PRESET}}$ is an L level, the respective frequency dividing circuits $B_1 \ldots B_n$ of the counter 110 are preset and the respective outputs $Q_1, Q_2 \ldots Q_{n-1}, Q_n$ rise to the set condition, and the outputs from the respective $\overline{Q}$ ... $\overline{Qn}$ terminals become an L level. Then, when the preset signal $\overline{PRESET}$ becomes an H level, the counting operation is started, and with the input of the initial clock signal CK, all of the frequency dividing circuits $B_1 \ldots B_n$ are successively reset so that the respective outputs $Q_1 \ldots Q_n$ fall and the outputs $\overline{Q}$ rise, and an input signal of a higher level than the power source potential Vcc is input from the rise detection circuit 111 to the trigger terminal of the self hold circuit 112. Since a signal of H level is already being input to the hold terminal of the self hold circuit 112, then a reset verification signal is generated from the self hold circuit 112 and input to the hold terminal of the next stage self hold circuit 117.

After this, when the $(2^{n-1}+1)$ clock signals CK have been input to the counter 110, the output $Q_n$ from the final stage frequency dividing circuit $B_n$ rises and an output is thus produced from the counter 110. As a result, a differentiated signal of a higher level than the power source potential Vcc is input from the rise detection circuit 116 to the trigger terminal of the self hold circuit 117. An output is thus generated from the self hold circuit 117 and self held, so that the output $Q_n$ from the counter 110 is stored and an effective count result output is produced.

With such a construction, in the case where the output $\overline{Qn}$ erroneously rises due to a fixed fault of the $\overline{Qn}$ terminal, then an erroneous reset verification signal is generated from the self hold circuit 112. However, the input for the D terminal is fixed by the fixed fault of the $\overline{Qn}$ terminal and hence the output $Q_n$ is fixed and does not change. Consequently, a differentiated output from the rise detection circuit 116 is not generated and hence the input level of the trigger terminal of the self hold circuit 117 does not become a higher level than the power source potential Vcc, and an output is thus not generated from the self hold circuit 117.

Furthermore, in the case where, in addition to the above-mentioned fault, a short circuit fault occurs between the input side for the clock signal CK and the $Q_n$ terminal of the frequency dividing circuit Bn, then due to the clock signal CK, a differentiated signal will be generated from the rise detection circuit 116, and an output thus produced from the self hold circuit 117. However, in this case also, as shown in FIG. 7, a frequency discriminating circuit 105 can be provided, and the abnormality thus found by carrying out a logical product operation on the respective outputs from the frequency discriminating circuit 105 and the self hold circuit 117.

Consequently, with the circuit configuration of the second embodiment, then again the fail-safe characteristics of the counting apparatus can be improved, so that when applied to an on-delay timer, the fail-safe characteristics of the on-delay timer are improved.

Next is a description of rotation stopped detection apparatuses which utilize the counting apparatus according to the first aspect of the invention.

Figure 8:
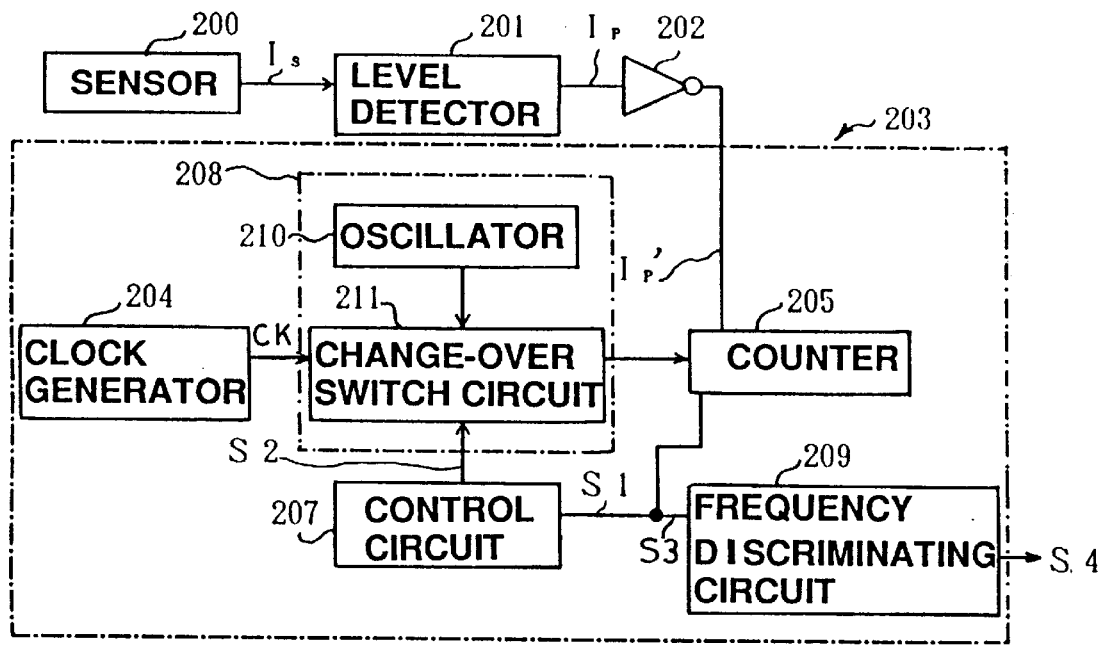
FIG. 8 is a circuit diagram of a first embodiment of a rotation stopped detection apparatus according to a third aspect of the invention.

FIG. 8 shows a circuit configuration of a first embodiment of a rotation stopped detection apparatus according to a third aspect of the invention.

In FIG. 8, a sensor 200 is a rotation sensor for detecting rotation of a rotation body (not shown in the figure) such as a motor. The sensor 200 is positioned facing recesses and protrusions provided for example on a surface of a metal movable portion of a motor, with a transducer coil in close proximity thereto. An AC signal $I_S$ corresponding to a change in the distance between the coil and the surface of the movable portion with rotation of the motor, is generated from the sensor 200. A level detector 201 detects the level of the AC signal $I_S$ from the sensor 200 and converts this into a pulse signal $I_P$. The pulse signal $I_P$ is then inverted by an inverter 202, and the inverted signal $I_P'$ is input as a reset signal, to a timer circuit 203 which utilizes the counting apparatus according to the first aspect of the invention.

The level detector 201 may be constructed such that the level is detected with a known fail-safe window comparator/AND gate, and the output therefrom rectified by a voltage doubler rectifying circuit to give the pulse signal $I_P$. The fail-safe window comparator/AND gate, and the voltage doubler rectifying circuit are devices known for example from International Patent Publication Nos. WO94/23303 and WO94/23496.

The timer circuit 203 comprises: a clock generator 204 for generating a clock signal CK for fixed interval timing; a counter 205 serving as a pulse counting device, which is reset with each input of an inverted signal $I_P'$ from the inverter 202, for counting the number of inputs of the pulse signal of the signal being counted with rising of the inverted signal $I_P'$, and generating an output signal S1 when the number of inputs reaches a predetermined number (corresponding to a previously set rotation stopped judgment set time); a control circuit 207 serving as a control device, which outputs a control signal S2 for switching a pulse signal to be counted by the counter 205, when the output signal S1 from the counter 205 is input thereto; a signal switching circuit 208 serving as a signal switching device for switching the pulse signal of the signal to be counted and input to the counter 20, between said clock signal CK and a high frequency pulse signal of a higher frequency than that of the clock signal CK, on input of the control signal S2 from the control circuit 207; and a frequency discriminating circuit 209 for judging the frequency of a dividing signal S3 generated from the counter 205 each time the number of inputs of the high frequency pulse signal becomes a predetermined number, and generating an H level judgment signal S4 indicating that rotation has stopped, when the dividing signal S3 is a predetermined frequency.

The signal switching circuit 208 may comprise: an oscillator 210 for generating a high frequency pulse signal; and a change-over switch circuit 211 for switching, when the control signal S2 is input from the control circuit 205, the connection of the clock generator 204 and the oscillator 210 relative to the counter 205 so that the high frequency pulse signal from the oscillator 210 is input to the counter 205. If the signal switching circuit 208 is described so as to correspond to the counting apparatus of FIG. 1, then the oscillator 210 corresponds to the oscillator 10, and the change-over switch circuit 211 corresponds to the AND gate 9 and the OR gate 4. Moreover, the control circuit 207 corresponds to the self hold circuit 5. In this case, the construction may be such that, for example, the inverted signal $I_P'$ is input to the hold terminal of the control circuit 207.

The frequency discriminating circuit 209 may comprise for example, a band-pass filter which only passes a signal of a predetermined frequency, and a rectifying circuit for rectifying the output from the band-pass filter. The counter 205 may comprise for example, a plurality of F•F circuits connected in cascade, and made to correspond to the rotation stopped judgment time which has been set beforehand, such that an output is generated when, for example, a predetermined number of clock signal are counted.

Next is a description of the operation of the rotation stopped detection apparatus of this embodiment.

Figure 9:
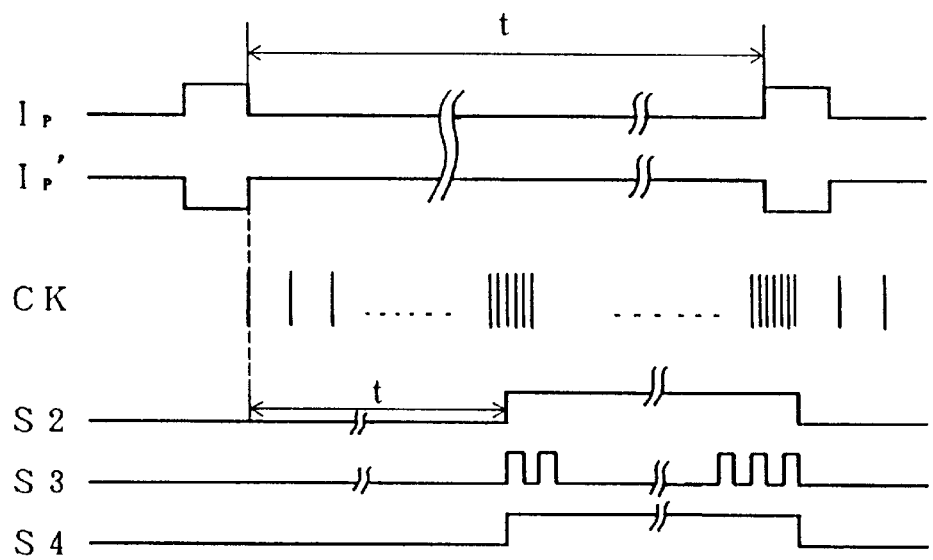
FIG. 9 is an operation time chart for the circuit of FIG. 8.

The AC signal $I_S$ is generated from the sensor 200 with rotation of the motor (not shown in the figure), and is level detected by the level detector 201 and a pulse signal $I_P$ shown in FIG. 9 is produced. With the pulse signal $I_P$, a pulse interval T becomes longer as the rotational speed of the motor drops. The pulse signal $I_P$ is inverted by the inverter 202, and the inverted signal $I_P'$ is input to an active low reset terminal of the counter 205. The counter 205 is reset with a fall of the inverted signal $I_P'$, and the reset is released with a rise. After this, the counting operation for the clock signal CK being input starts.

When the rotation of the motor is fast, the inverted signal $I_P'$ is input to the counter 205 before the number of clock signals CK being input to the counter 205 reaches a predetermined number, and the counter 205 is reset. Consequently, the output signal S1 and the dividing signal S3 from the counter 205 are not generated, and hence the high level judgment signal S4 indicating that rotation has stopped is not generated, thus advising that the motor is still rotating.

When the rotation of the motor drops so that, as shown in FIG. 9, the pulse interval T of the pulse signal $I_P$ becomes longer than a set time t which has been previously set for rotation stopped judgment, then the predetermined number of the clock signals CK are input prior to resetting with the next inverted signal $I_P'$, and hence an output signal S1 is generated from the counter 205. With the control circuit 207, due to the input of the output signal S1, the control signal S2 as shown in FIG. 9, is output to the change-over switch circuit 211 of the signal switching circuit 208. Due to the input of the control signal S2, the change-over switch circuit 211 switches the oscillator 210 side to connected to the counter 205, so that a high frequency pulse signal is input to the counter 205. The counter 205 counts the high frequency pulse signal being input, and each time a predetermined number is reached, outputs the dividing signal S3 shown in FIG. 9 to the frequency discriminating circuit 209. If the frequency of the dividing signal S3 is a predetermined frequency, then the H level judgment signal S4, as shown in FIG. 9, is generated from the frequency discriminating circuit 209. This judgment signal S4 indicates that rotation of the motor has stopped, and also indicates that the counting operation of the counter 205 is being carried out normally.

With such a construction, since the timer circuit 203 incorporates the function of monitoring, after the clock signal counting operation, for the normalcy of the counting operation of the counter 205, using the high frequency pulse signal, then the reliability of the timer circuit 203 is improved. Moreover, the reliability of a system for carrying out rotation stopped detection by using the timer to measure the generation interval of the pulse signal $I_P$ which is based on the AC signal $I_S$ from the sensor 200, is improved.

If the counter 205 has the reset verification function of for example FIG. 6 and FIG. 7, then the reliability of the timer 203 can be even further improved.

In the case where the reset verification function is included, then the inverted signal $I_P'$ may be input to the hold terminal of the self hold circuit 102 of FIG. 5 or the self hold circuit 112 of FIG. 7, and the output from the self hold circuit 104 or the self hold circuit 117, input to the control circuit 207 as the output signal S1, and the output from the Q terminal of the final stage frequency dividing circuit input to the frequency discriminating circuit 209 as the dividing signal S3.

With the abovementioned first embodiment, the generation frequency of the pulse signal $I_P$ for indicating motor rotation is determined based on the time of the generation interval of the pulse signal $I_P$, so that when the generation interval of the pulse signal $I_P$ is equal to or greater than a predetermined time t, the pulse generation frequency is judged to be equal to or less than a predetermined frequency and the rotation stopped condition is thus judged, with the motor rotation being sufficiently low.

Figure 10:
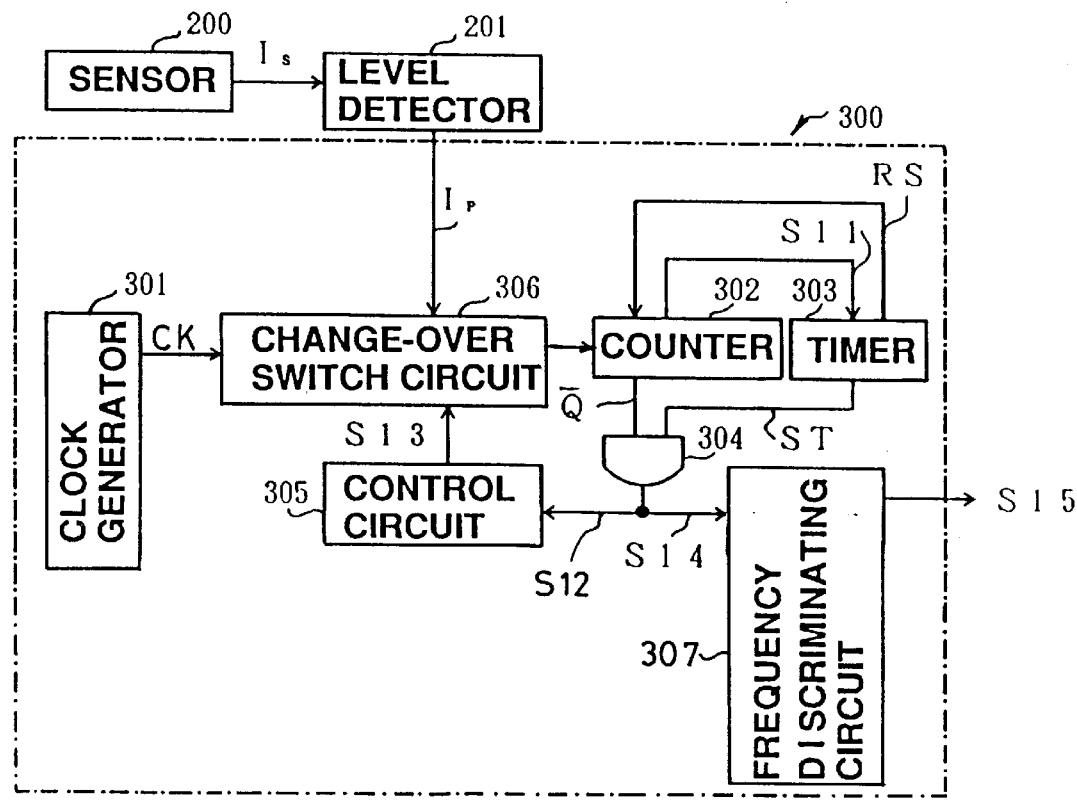
FIG. 10 is a circuit diagram of a second embodiment.

FIG. 10 shows the circuit configuration of a second embodiment of a rotation stopped detection apparatus. This embodiment is one where the generation frequency of the pulse signal $I_P$ is determined based on the number of pulses generated per predetermined time. Elements the same as for the embodiment of FIG. 8 are indicated by the same symbols and description is omitted.

In FIG. 10, a timer circuit 300 of this embodiment comprises: a clock generator 301 for generating a fixed interval clock signal CK; a counter 302 serving as a pulse counting device, for counting pulse signals input via a change-over switch circuit 306 to be described later, and generating an L level output from a $\overline{Q}$ terminal when the number of pulse signals reaches a predetermined number; a timer 303 serving as a time measuring means, which feeds back a reset signal RS to the counter 302 when reset by a signal S11 failing synchronously with the $\overline{Q}$ output from the counter 302 (or the $\overline{Q}$ output itself) so that timing is started in synchronous with the start of the counting operation of the counter 302, to generate an output signal ST after lapse of a predetermined time t; an AND gate 304 for carrying out a logical product operation on the $\overline{Q}$ output from the counter 302 and the output signal ST from the timer 303; a control circuit 305 serving as a control device, for outputting a control signal S13 for switching the counting pulse signal for input to the counter 302, when an output signal S12 from the AND gate 304 is input thereto; a change-over switch circuit 306 serving as a signal switching device, for switching the counting pulse signal for the counter 302 to a clock signal CK of a higher frequency than a pulse signal $I_P$, with input of the control signal S13 from the control circuit 305; and a frequency discriminating circuit 307 serving as a frequency discriminating device, for judging the frequency of a dividing signal S14 generated from the AND gate 304 based on the counting operation for the clock signal CK, and generating an H level judgment signal S15 indicating that rotation has stopped, when the dividing signal S14 is a predetermined frequency.

The counter 302 is for example a device as described in relation to FIG. 7, with D-F•F circuits connected in cascade. Moreover, the counter 302 is constructed such that once the output signal S12 is generated from the AND gate 304, then synchronization of the $\overline{Q}$ output with the signal S11 is stopped, for example by a control signal from the control circuit 305, and the signal S11 is maintained at the H level.

Next is a description of the operation.

An AC signal $I_S$ is generated from the sensor 200, with rotation of the motor (not shown in the figure), and is level detected by the level detector 201 and a pulse signal $I_P$ produced. The pulse signal $I_P$ is input to the counter 302 via the change-over switch circuit 306 of the timer circuit 300. The counter 302 counts the number of inputs of the pulse signal $I_P$, and when this becomes a predetermined number, the $\overline{Q}$ output drops. The signal S11 synchronized with the dropping of the $\overline{Q}$ output then becomes an L level so that the timer 303 is reset and at the same time, a reset signal RS from the timer 303 is fed back to the counter 302 side so that the counter 302 is also reset. The counter 302 and the timer 303 thus simultaneously start the counting operation with the rising of the reset signal RS.

Figure 11:
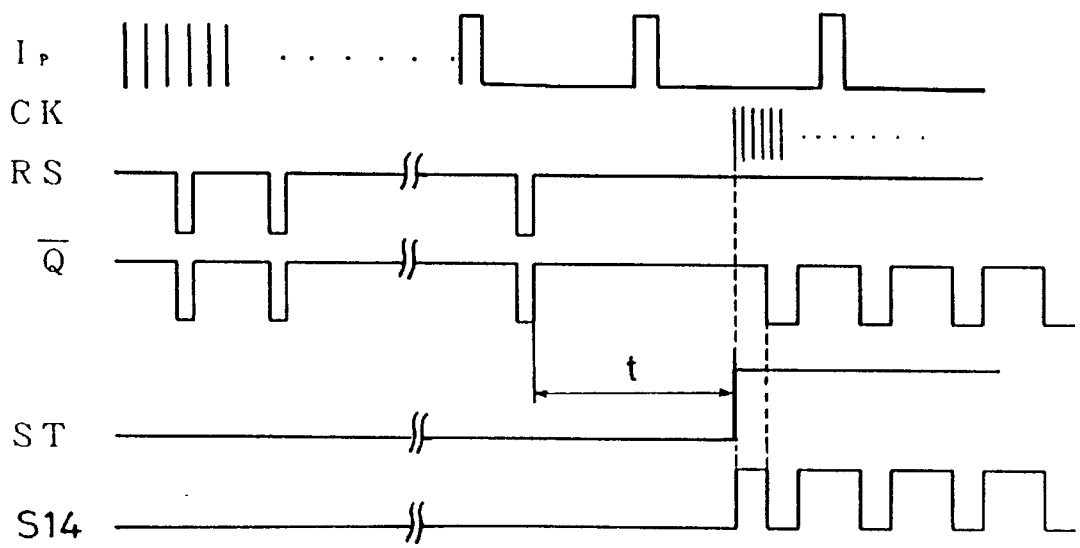
FIG. 11 is an operation time chart for the circuit of FIG. 10.

When the rotation of the motor is fast so that the number of generations of the pulse signal $I_P$ per unit time is large, the time taken for the number of inputs of the pulse signal $I_P$ being input to the counter 302 to reach the predetermined number is less, and hence as shown in FIG. 11, the $\overline{Q}$ output drops before the predetermined time t for generation of the output signal ST. Consequently the output signal S12 from the AND gate 304 is not generated, the timer 303 and the counter 302 are reset together, and the timing for a predetermined time t and the counting operation for the pulse signal $I_P$ are repeated.

When the rotation of the motor drops so that the number of generations of the pulse signal $I_P$ per unit time becomes small, then as shown in FIG. 11, the predetermined time t elapses before the number of inputs of the pulse signal $I_P$ for input to the counter 302 reaches the predetermined number. Hence the output signal ST is generated from the timer 303, and the output signal S12 is generated from the AND gate 304. As a result, the control signal S13 is generated from the control circuit 305, and the input pulse to the counter 302 is switched by the change-over switch circuit 306, to the clock signal CK from the clock generator 301.

After this, since the signal S11 is maintained at the H level and the output signal ST thus continues to be generated without reset of the timer 303, then the dividing signal S14 is generated each time a predetermined number of clock signals CK are input to the counter 302. Then if the frequency of the dividing signal S14 is a predetermined frequency, an H level judgment signal S15 is generated from the frequency discriminating circuit 307, thus advising that the counting operation of the counter 302 is normal, and that motor rotation has stopped. As a result, it is possible to advise that rotation has stopped, while also monitoring the counting operation of the counter 302.

Figure 12:
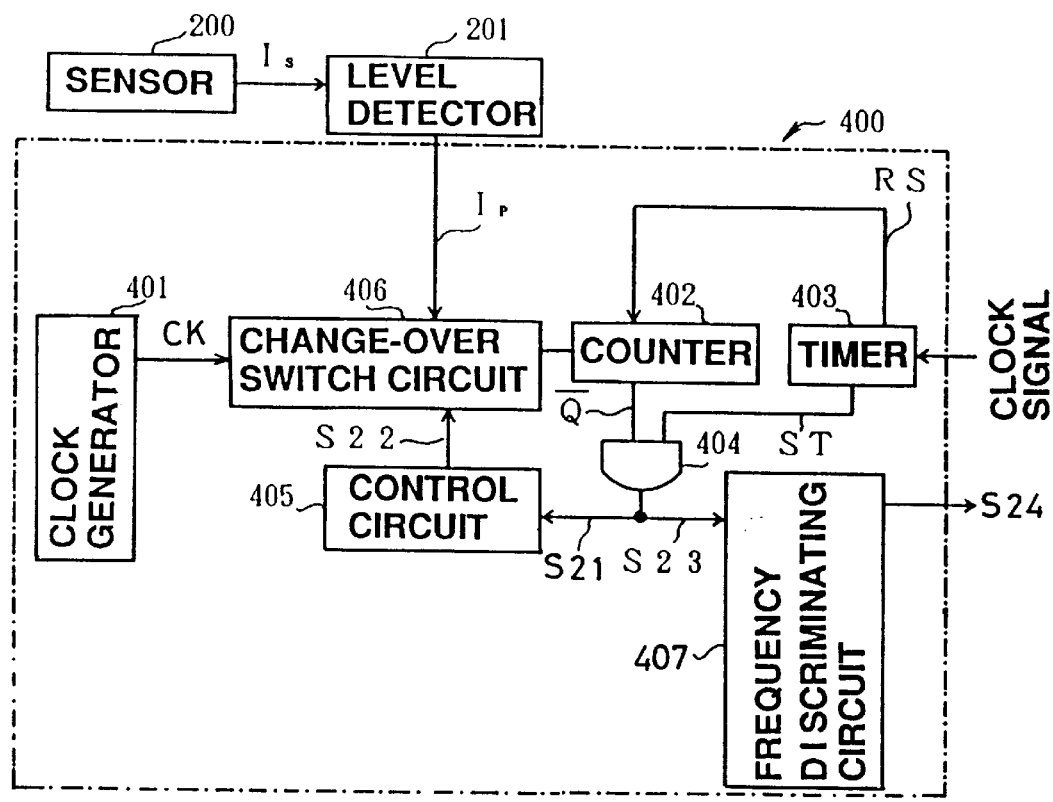
FIG. 12 is a circuit diagram of a third embodiment.

FIG. 12 shows an other embodiment for where the generation frequency of the pulse signal $I_P$ is determined based on the number of pulses generated per predetermined time. Elements the same as for the embodiment of FIG. 10 are indicated by the same symbols and description is omitted.

In FIG. 12, a timer circuit 400 of this embodiment comprises: a clock generator 401, a counter 402, a timer 403, an AND gate 404, a control circuit 405, a change-over switch circuit 406, and a frequency discriminating circuit 407.

The timer 403 of this embodiment is reset by a reset signal from outside, and carries out timing based on an external clock signal so as to generate a reset signal RS for the counter 402 for each predetermined time $t_0$. Furthermore, the timer 403 carries out timing synchronously with the output from the reset signal RS and based on the external clock signal and after elapse of a predetermined time t (t<$t_0$) for carrying out timing, outputs an output signal ST to the AND gate 404. The construction is such that the counter 402 is reset with input of the reset signal RS from the timer 403, causing the $\overline{Q}$ terminal output to rise. The timing for the input pulse then starts, and each time a predetermined number of timing is carried out, the $\overline{Q}$ output drops and the L level $\overline{Q}$ output is input to the AND gate 404.

The operation of the other components such as the clock generator 401, the control circuit 405, the change-over switch circuit 406, and the frequency discriminating circuit 407, is practically the same as in the embodiment of FIG. 10. With the control circuit 405, when an output signal S21 from the AND gate 404 is input thereto, a control signal S22 is output to the change-over switch circuit 406, thereby controlling the switching of the input pulse signal to the counter 402. The frequency discriminating circuit 407 receives the input of a dividing signal S23 after the pulse signal switching, and if the dividing signal S23 is a predetermined frequency, generates an H level judgment signal S24.

Next is a description of the operation.

The counter 402 is reset by the reset signal RS from the timer 403, thereby starting the counting for the pulse signal $I_P$ input via the change-over switch circuit 406. Moreover, due to the reset signal RS, the $\overline{Q}$ output from the counter 402 rises.

Figure 13:
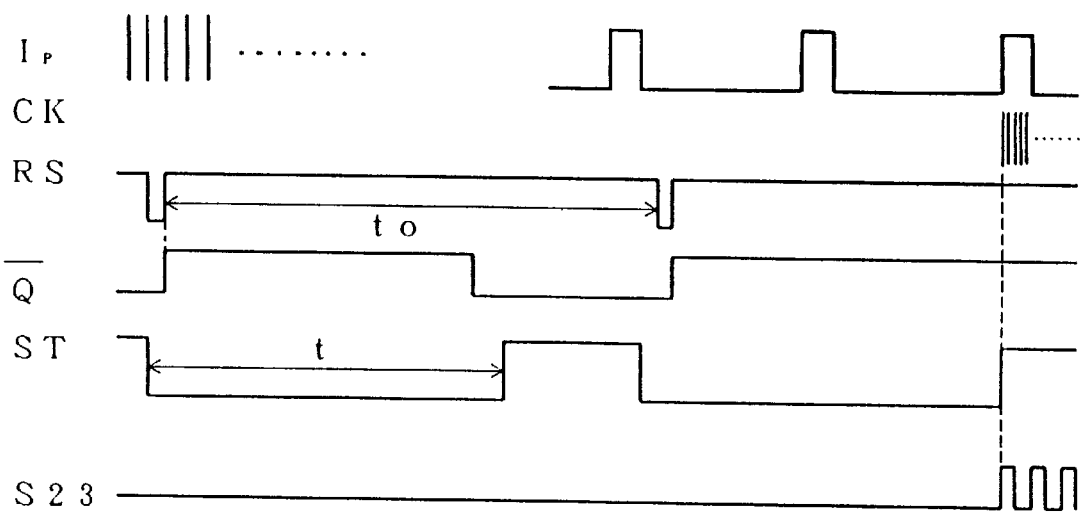
FIG. 13 is an operation time chart for the circuit of FIG. 12.

When the rotation of the motor is fast so that the number of generations of the pulse signal $I_P$ per unit time is large, the time taken for the number of inputs of the pulse signal $I_P$ being input to the counter 402 to reach the predetermined number is less, and hence as shown in FIG. 13, the $\overline{Q}$ output drops before a predetermined time t for generation of the output signal ST. Consequently the output signal S21 from the AND gate 404 is not generated When the rotation of the motor drops so that the number of generations of the pulse signal $I_P$ per unit time becomes small, then as shown in FIG. 13, the predetermined time t elapses before the number of inputs of the pulse signal $I_P$ for input to the counter 402 reaches the predetermined number. Hence the output signal ST is generated from the timer 403, and the output signal S21 is generated from the AND gate 404. As a result, the control signal S22 is generated from the control circuit 405, and the input pulse to the counter 402 is switched by the change-over switch circuit 406, to the clock signal CK.

After this, since the reset operation for the timer 403 is stopped and the output signal ST thus continues to be generated, then the dividing signal S23 is generated continuously based on the $\overline{Q}$ output from the counter 402. If the frequency of the dividing signal S23 is a predetermined frequency, an H level judgment signal S24 is generated from the frequency discriminating circuit 407, thus advising that the counting operation of the counter 402 is normal, and that motor rotation has stopped. As a result, as with the second embodiment, it is possible to advise that rotation has stopped while also monitoring the counting operation of the counter 403.

In order for the rotation stopped detection apparatus of this embodiment to be made fail-safe, it is sufficient if the timer 403 satisfies the characteristic that the generation period of the output signal ST is not shortened with a fault.

INDUSTRIAL APPLICABILITY

The present invention enables an increase in the reliability of various apparatus and systems which use counting apparatus, and hence has significant industrial applicability.

What is claimed is:

1. A counting apparatus comprising:

pulse counting means for counting the number pulses of a pulse signal being counted that is input thereto, and for generating an output when said number pulses of the pulse signal being counted reaches a predetermined value;

signal switching means for switching between said pulse signal being counted and a high frequency pulse signal of a higher frequency than said pulse signal being counted;

control means for controlling said signal switching means so that the pulse signal input to said pulse counting means is switched to said high frequency pulse signal when said output generated from said pulse counting means is input to said control means; and frequency discriminating means which is input with a dividing signal generated from said pulse counting means each time the number of said high frequency pulse signal input to said pulse counting means reaches said predetermined value, and which generates an output indicating that a counting operation of said pulse counting means is acceptable only when said dividing signal is a predetermined frequency.

2. A counting apparatus according to claim 1, wherein said control means includes:

a self hold circuit which, under the proviso that said pulse signal being counted is being input to a hold terminal, generates an output signal from said self hold circuit when said output from said pulse counting means is input to a trigger terminal, and feeds output signal from said self hold circuit back to said trigger terminal to thus self hold said output signal.

3. A counting apparatus according to claim 2, wherein said signal switching means includes:

an oscillator for generating the high frequency pulse signal;

a logical product operation circuit for carrying out a logical product operation on the high frequency pulse signal from said oscillator and the output signal from said self hold circuit; and a logical sum operation circuit for carrying out a logical sum operation on the logical product output from said logical product operation circuit, and the pulse signal being counted, and inputting a logical sum output to said pulse counting means.

4. A counting apparatus according to claim 2, wherein said signal switching means includes:

an oscillator for generating said high frequency pulse signal;

a transistor for receiving, at its transistor base terminal, the high frequency pulse signal from said oscillator;

a photocoupler for generating an AC output synchronously with the switching operation of said transistor; and a logical sum operation circuit for summing, with a wired OR connection, said AC output from said photocoupler and said pulse signal being counted, and for providing a sum to said pulse counting means.

5. A counting apparatus according to claim 2, wherein said signal switching means includes:

an oscillator for generating said high frequency pulse signal, with said output signal from said self hold circuit as a drive power source; and a logical sum operation circuit for summing, with a wired OR connection, said high frequency pulse signal from said oscillator and said pulse signal being counted, and for providing a sum to said pulse counting means.

6. A counting apparatus according to claim 1, wherein said frequency discriminating means includes:

a band-pass filter which only passes said dividing signal when said dividing signal is said predetermined frequency; and a rectifying circuit for rectifying an output from said band-pass filter.

7. A counting apparatus comprising:

pulse counting means made up of a plurality of frequency dividing circuits connected in cascade, for counting the number of pulses of a pulse signal being counted that is input thereto, and for generating an output when said number pulses of the pulse signal being counted reaches a predetermined value;

reset verification means for verifying, after input of a preset signal, that said output from said pulse counting means has become a low level and has been reset, and for then generating a reset verification signal;

output generating means for transmitting said output generated from said pulse courting means as an effective counting result output, under the proviso that said reset verification signal has been generated front said reset verification means; and a frequency discriminating circuit which generates an output signal, indicating that a counting operation of said pulse counting means is acceptable only when said output from said pulse counting means is a predetermined frequency.

8. A counting apparatus according to claim 7, wherein:

A) said reset verification means includes:

1) a fall detection circuit which detects a fall in said output from said pulse counting means and generates a fall detection signal; and 2) a first self hold circuit with said fall detection signal input to a trigger terminal of the first self hold circuit, and said preset signal input to a hold terminal of the first self hold circuit, for generating an output signal when said fall detection signal is input to said trigger terminal of said first self hold circuit and said preset signal is input to said hold terminal of said first self hold circuit, and being adapted for feeding said output signal of said first self hold circuit back to the trigger terminal of said first self hold circuit to self hold said output signal as said reset verification signal, and B) said output generating means includes:

1) a rise detection circuit for detecting a rise in said output from said pulse counting means and for generating a rise detection signal; and 2) a second self hold circuit with said rise detection signal input to a trigger terminal of said second self hold circuit, and the reset verification signal of said second self hold circuit input to a hold terminal of said second self hold circuit, for generating an output signal when said rise detection signal is input to said trigger terminal of said second self hold circuit and said reset verification signal is input to said hold terminal of said second self hold circuit, and being adapted for feeding said output signal back to the trigger terminal to self hold said output signal as a counting result output.

9. A counting apparatus according to claim 7, wherein:

A) said frequency dividing circuits of said pulse counting means are flip-flop circuits connected in cascade, each having a first output terminal and a second output terminal, B) said reset verification means includes:

1) a first rise detection circuit for detecting a rise in the output from said second output terminal of the last flip-flop circuit and generating a rise detection signal superimposed with a predetermined potential; and 2) a first self hold circuit with said rise detection signal from said first rise detection circuit input to a trigger terminal of said first self hold circuit, and said preset signal input to a hold terminal of said first self hold circuit, for generating an output signal, and being adapted for feeding said output signal back to the trigger terminal of said first self hold circuit to self hold said output signal as said reset verification signal, and which does not generate said output signal at the time of fault, and C) said output generating means includes:
1) a second rise detection circuit for detecting a rise in the output from said first output terminal of the last flip-flop circuit and generating a rise detection signal superimposed with said predetermined potential; and
2) a second self hold circuit with the rise detection signal from said second rise detection circuit input to a trigger terminal, and the reset verification signal from said first self hold circuit input to a hold terminal, for generating an output signal when said rise detection signal from the second rise detection circuit of a higher level than said predetermined potential is input to said trigger terminal of said second self hold circuit and the reset verification signal is input to said hold terminal of said second self hold circuit, and being adapted for feeding said output signal of said second self hold circuit back to the trigger terminal of said second self hold circuit to self hold said output signal as a counting result output, and which does not generate said output signal at the time of fault.

10. A counting apparatus according to claim 9, wherein:

said first self hold circuit includes a first fail-safe logical product operation circuit which generates a first AC output when input signals of a higher potential than said predetermined potential are input to the two input terminals of the first self hold circuit, and which do not generate said first AC output at the time of fault, said first AC output is rectified by a voltage doubler rectifying circuit and fed back to said trigger terminal of the first self hold circuit via a feedback resistor;

said second self hold circuit includes a second fail-safe logical product operation circuit that generates a second AC output when input signals of a higher potential than said predetermined potential are input to the two input terminals of the second self hold circuit, and that does not generate the second AC output at the time of fault.

* * * * *